United States Patent
Noie et al.

(10) Patent No.: US 10,644,629 B2
(45) Date of Patent: May 5, 2020

(54) FAN MOTOR DRIVING CIRCUIT, DRIVING METHOD, AND COOLING DEVICE AND ELECTRONIC MACHINE USING THE SAME

(71) Applicant: ROHM CO., LTD., Kyoto-shi, Kyoto (JP)

(72) Inventors: Joji Noie, Kyoto (JP); Tomofumi Mishima, Kyoto (JP); Yuki Gohara, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/274,639

(22) Filed: Feb. 13, 2019

(65) Prior Publication Data

US 2019/0260316 A1    Aug. 22, 2019

(30) Foreign Application Priority Data

Feb. 16, 2018 (JP) .................. 2018-025704

(51) Int. Cl.
*H02P 7/29* (2016.01)
*H02P 7/03* (2016.01)
(Continued)

(52) U.S. Cl.
CPC .............. *H02P 7/29* (2013.01); *H02M 3/156* (2013.01); *H02P 6/06* (2013.01); *H02P 7/04* (2016.02);
(Continued)

(58) Field of Classification Search
USPC ....................................................... 318/599
See application file for complete search history.

(56) References Cited

U.S. PATENT DOCUMENTS 7,923,955 B2 *  4/2011  Shin ....................... G05D 19/02
                                                        267/140.15
8,193,753 B2 *  6/2012  Matsunaga ............... H02P 6/06
                                                              318/599
(Continued)

FOREIGN PATENT DOCUMENTS

CN          104426441 A       3/2015

OTHER PUBLICATIONS

Taiwanese First Office Action corresponding to Application No. 10820941720; dated Oct. 3, 2019.

*Primary Examiner* — Bentsu Ro
(74) *Attorney, Agent, or Firm* — Cantor Colburn LLP

(57) ABSTRACT

The present invention relates to a fan motor driving circuit, a driving method, and a cooling device and an electronic machine using the same. The present invention provides a motor driving circuit capable of suppressing strain on coil current and/or reducing noise. A control circuit a control circuit switches an output phase of an H-bridge circuit based on a Hall signal, and in a soft switching duration (Tss) that starts before and ends after the output-phase switching, slowly varies a duty ratio (DUTY1) of an output voltage ($V_{OUT1}$) of one leg of the H-bridge circuit over time, and meanwhile, varies a duty ratio (DUTY2) of an output voltage ($V_{OUT2}$) of another leg of the H-bridge circuit in an opposite direction with respect to the duty ratio (DUTY1) of the output voltage ($V_{OUT1}$) of the one leg.

19 Claims, 15 Drawing Sheets

(51) Int. Cl.
*H05K 7/20* (2006.01)
*H02M 3/156* (2006.01)
*H02P 6/06* (2006.01)

(52) U.S. Cl.
CPC ..... *H05K 7/20209* (2013.01); *H02P 2209/00* (2013.01)

(56) References Cited

U.S. PATENT DOCUMENTS

| | | | |
|---|---|---|---|
| 8,264,189 B2 * | 9/2012 | Matsunaga | H02K 7/116 318/400.09 |
| 2009/0096402 A1 * | 4/2009 | Miyajima | H02P 6/16 318/473 |

* cited by examiner

Pulse Width Modulation = H

Pulse Width Modulation = L

FAN MOTOR DRIVING CIRCUIT, DRIVING METHOD, AND COOLING DEVICE AND ELECTRONIC MACHINE USING THE SAME

CROSS-REFERENCE TO RELATED APPLICATION

The present invention claims priority under 35 U.S.C. § 119 to Japanese Patent Application No. 2018-025704, filed on Feb. 16, 2018, which is incorporated by reference in its entirety.

TECHNICAL FIELD

The present disclosure relates to fan motor driving technique.

DISCUSSION OF THE BACKGROUND

A fan motor is mounted in various electronic devices such as server, laptop, desktop computer, portable computer, game device, projector, and VR (Virtual Reality) etc. In addition, a fan motor is also mounted in refrigerator, automobile, industrial machine, or the like.

In a platform having a processor such as CPU (Central Processing Unit) or MPU (Micro-Processing Unit) mounted thereon, the number of revolutions of a fan motor can be controlled in accordance with an instruction from the processor. Specifically, a control signal indicating the target number of revolutions is provided to a fan motor driver from the processor. The fan motor driver generates a PWM (pulse width modulation) signal having a duty ratio corresponding to the control signal so as to drive the fan motor.

In addition, in order to improve the quietness, PWM (Pulse Width Modulation) soft switching is performed by slowly switching the coil current before and after switching of the output phase.

FIG. 1A and FIG. 1B are diagrams showing a state transition of an H-bridge circuit during PWM driving. In the conventional PWM driving, in a state where an output (OUT2) is fixed as a low level (low), another output (OUT1) is switched in accordance with the PWM signal. In a section where the PWM signal is at high level, as shown in FIG. 1A, the transistors MH1 and ML2 are turned on, and the coil current $I_{COIL}$ flows through the first path including the transistor MH1, a motor coil L, and the transistor ML2. In a section where the PWM signal is at low level, as shown in FIG. 1B, the transistors ML1 and ML2 are turned on, and the coil current $I_{COIL}$ flows through the second path including the transistor ML1, the motor coil L, and the transistor ML2.

FIG. 2 is a waveform diagram illustrating the PWM soft switching. Time to is the current zero crossing point at which the direction of the coil current is reversed. A soft switching duration Tss is set in such a manner as to include the current zero crossing point. As shown in FIG. 1A and FIG. 1B, the output voltage $V_{OUT1}$ during the period before the current zero crossing point to in the soft switching duration Tss is pulse width modulated, and its duty ratio changes slowly with time. The output voltage $V_{OUT2}$ during the period after the current zero crossing point to is pulse width modulated. Accordingly, the coil current $I_{COIL}$ can be slowly changed, and noise can be reduced.

SUMMARY

Problems to be Solved in the Present Invention

The inventors of the present invention conducted research on the soft switching, and thus recognized the following problems.

In recent years, motors have been miniaturized and thinned, and these motors cannot increase the number of turns of coils, such that the inductance is small.

FIG. 3A and FIG. 3B are waveform diagrams (measured) when motors having different inductances are driven at a same PWM frequency. The uppermost FG (Frequency Generator) signal is a signal based on the rotor position detected by the Hall effect sensor. FIG. 3A shows a waveform when a fan motor of a notebook computer with L=0.57 mH is driven, and FIG. 3B shows a waveform when an ultra-small fan motor with L=0.15 mH is driven.

As shown from the comparison of FIG. 3A and FIG. 3B, in order to smoothly change the coil current $I_{COIL}$ by the PWM soft switching, the inductance of the coil must be increased for certain degree. When the motor with the smaller inductance is driven by the PWM frequency of 20 kHz-60 k Hz or so, the strain on the coil current is generated as well as the noise.

In order to obtain an air volume, an ultra-small and thin fan motor rotates at a high number of revolutions. Therefore, at the PWM frequency of 50 kHz or so, the duty ratio variation of the PWM soft switching becomes discrete, resulting in FG jitter (uneven rotation).

In order to solve these problems, methods for increasing the PWM frequency can be used, but it is not very easy since the switching speed of the H-bridge circuit of the output section is limited.

In addition, such problem cannot be understood as general knowledge for persons skilled in the art.

The present invention has been completed in view of the problem, and one of the purposes of one embodiment thereof is to provide a motor driving circuit capable of suppressing strains of the coil current and/or reducing the noise.

Technical Means for Solving Problems

One embodiment of the present invention relates to a fan motor driving circuit for controlling a single-phase motor. The fan motor driving circuit includes a driving-signal generating portion and a pre-driver. The driving-signal generating portion generates a first PWM(Pulse Width Modulation) signal and a second PWM signal in a soft switching duration that starts before and ends after an output-phase switching of an H-bridge circuit connected to the single-phase motor. A duty ratio of the first PWM signal varies in a first direction over time, and a duty ratio of the second PWM signal varies in a second direction opposite to the first direction while the duty ratio of the first PWM signal varies. The pre-driver drives one leg of the H-bridge circuit based on the first PWM signal and drives another leg of the H-bridge circuit based on the second PWM signal.

Another embodiment of the present invention pertains to a cooling device. The cooling device includes a single-phase motor and an H-bridge circuit having an output connected to the single-phase motor. The cooling device also includes a Hall element generating a Hall signal indicating a rotor position of the single-phase motor. The cooling device also includes a driving circuit. The driving circuit switches an output phase of the H-bridge circuit based on the Hall signal. In a soft switching duration that starts before and ends after a switching, the driving circuit slowly varies a duty ratio of an output voltage of one leg of the H-bridge circuit, and meanwhile, varies a duty ratio of an output voltage of another leg of the H-bridge circuit in an opposite direction with respect to the duty ratio of the output voltage of the one leg.

In addition, the present invention may be applied through any combination of the above components, or applied by replacing components or presentations among methods, apparatuses, systems, etc of the present invention.

Effects of the Present Invention

According to an embodiment of the present invention, the strain of the coil current can be suppressed and/or the noise can be reduced.

DETAILED DESCRIPTION

Summary of the Embodiments

Figure 1A:
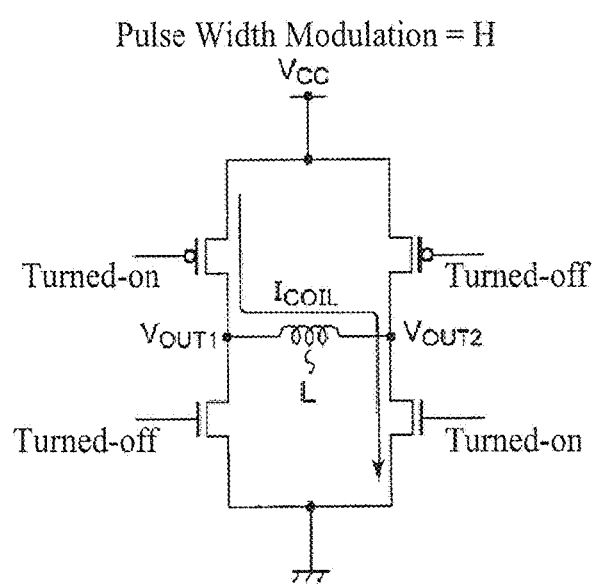
FIG. 1A and FIG. 1B are diagrams showing a state transition of an H-bridge circuit during PWM driving.
Figure 1B:
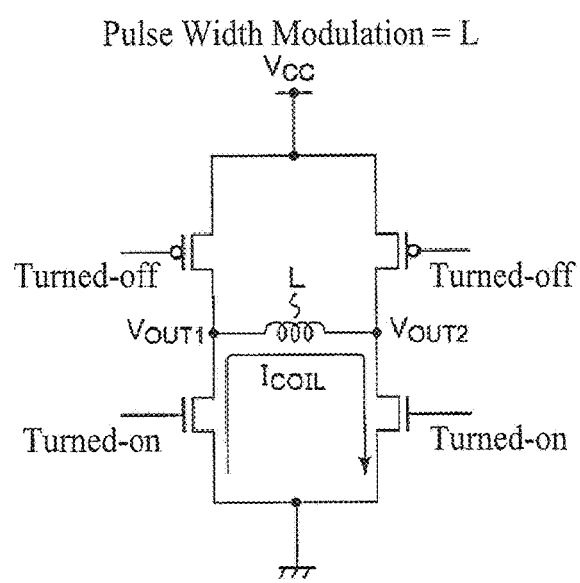

An embodiment disclosed in this specification relates to a fan motor driving circuit for controlling a single-phase fan motor. The driving circuit includes a driving-signal generating portion and a pre-driver. The driving-signal generating portion, generates a first PWM signal and a second PWM signal in a soft switching duration that starts before and ends after an output-phase switching of an H-bridge circuit connected to the single-phase motor. A duty ratio of the first PWM signal varies in a first direction over time, and a duty ratio of the second PWM signal varies in a second direction opposite to the first direction while the duty ratio of the first PWM signal varies. The pre-driver drives one leg of the H-bridge circuit based on the first PWM signal and drives another leg of the H-bridge circuit based on the second PWM signal.

According to the described embodiment, by simultaneously switching outputs of the two legs of the H-bridge circuit, the switching frequency of the voltage applied to the motor coil can be apparently set to twice the PWM frequency. Therefore, the strain of the coil current can be suppressed and/or the noise can be reduced. On the other hand, it is possible to reduce the PWM frequency required to obtain the same coil driving characteristics to ½ as compared with the prior art.

In the soft switching duration, a summation of the duty ratio of the first PWM signal and the duty ratio of the second PWM signal can also be fixed. In other words, by changing the two duty ratios complementarily, it is possible to control the pattern using the common waveform. Therefore, the hardware for generating these waveform-controlling patterns can be simplified, or the memory capacity can be reduced.

The driving-signal generating portion can also include a first cycle-signal generator and a second cycle-signal generator. The first cycle-signal generator generates a first cycle-signal. The second cycle-signal generator generates a second cycle-signal having a reversed phase relative to the first cycle-signal. The driving-signal generating portion can also include a pattern generator and a first comparator. The pattern generator generates a waveform-controlling pattern in the soft switching duration. The waveform-controlling pattern increases or decreases over time. The first comparator compares the first cycle-signal with the waveform-controlling pattern, and generates the first PWM signal based on the comparing result. The driving-signal generating portion can also include a second comparator. The second comparator compares the second cycle-signal with the waveform-controlling pattern, and generates the second PWM signal based on the comparing result.

In a normal driving duration, a difference between the duty ratio of the first PWM signal and the duty ratio of the second PWM signal is variable with respect to a target number of revolutions of the single-phase motor. Accordingly, both the revolution control and the soft switching control can be considered.

A summation of the duty ratio of the first PWM signal and the duty ratio of the second PWM signal can also be 100%. Accordingly, the effective PWM frequency of the driving voltage in the normal driving duration can coincide with the effective PWM frequency of the driving voltage in the soft switching duration.

In the normal driving duration, one of the duty ratio of the first PWM signal and the duty ratio of the second PWM signal can also be 0%.

The driving-signal generating portion can also include a first cycle-signal generator and a second cycle-signal generator. The first cycle-signal generator generates a first cycle-signal. The second cycle-signal generator generates a second cycle-signal having a reversed phase relative to the first cycle-signal. The driving-signal generating portion can also include a pattern generator generating a waveform-controlling pattern in the soft switching duration. The waveform-controlling pattern increases from a first value to a second value overtime or decreases from the second value to the first value over time. The driving-signal generating portion can also include a scaler scaling the waveform-controlling pattern with a coefficient corresponding to the target number of revolutions. The driving-signal generating portion can also include a first comparator. The first comparator compares the first cycle-signal with an output of the scaler, and generates the first PWM signal based on the comparing result. The driving-signal generating portion can also include a second comparator. The second comparator compares the second cycle-signal with an output of the scaler, and generates the second PWM signal based on the comparing result.

The first cycle-signal and the second cycle-signal can also be triangle waves. Accordingly, the second PWM signal can be set as a reversed phase relative to the first PWM signal.

The driving-signal generating portion can also set the soft switching duration based on a Hall signal representing a rotor position of the single-phase motor.

The fan motor driving circuit can also include a Hall element generating a Hall signal.

The fan motor driving circuit can also be integrated on one semiconductor substrate. The so called "integration" includes a case where all components of a circuit are formed on a semiconductor substrate, or main components of the circuit are integrated, and some resistors, capacitors or the like may be disposed outside the semiconductor substrate for adjusting the circuit constants. By integrating the circuit on a chip, the circuit area can be reduced, and the characteristics of the circuit elements can be kept uniform.

The H-bridge circuit can be further integrated on the fan motor driving circuit.

Embodiments

Hereinafter, the present invention will be described based on preferred embodiments with reference to the accompanying drawings. The same or equivalent constituent elements, components and processes shown in the drawings are denoted by the same reference numerals, and the repeated description is omitted as appropriate. In addition, the embodiments are merely illustrative and not limiting, and all features described in the embodiments or combinations thereof are not necessarily essential to the invention.

In this specification, the so called "state in which the component A and the component B are connected" includes the case where the component A and the component B are physically directly connected, and also the case where the component A and the component B are indirectly connected via other components which do not substantially affect their electrical connection state or which do not impair the function or effect exerted by their combination.

Similarly, the so called "state in which the component C is disposed between the component A and the component B" includes the case where the component A is directly connected to the component C or the component B is directly connected to the component C, and also includes the indirect connection via other components which do not substantially affect their electrical connection state or which do not impair the function or effect exerted by their combination.

For ease of understanding, the vertical and horizontal axes of the waveform diagram or timing diagram referred to in this specification are appropriately enlarged or reduced. In addition, the various waveforms shown are also simplified, exaggerated or emphasized for ease of understanding.

Figure 4:
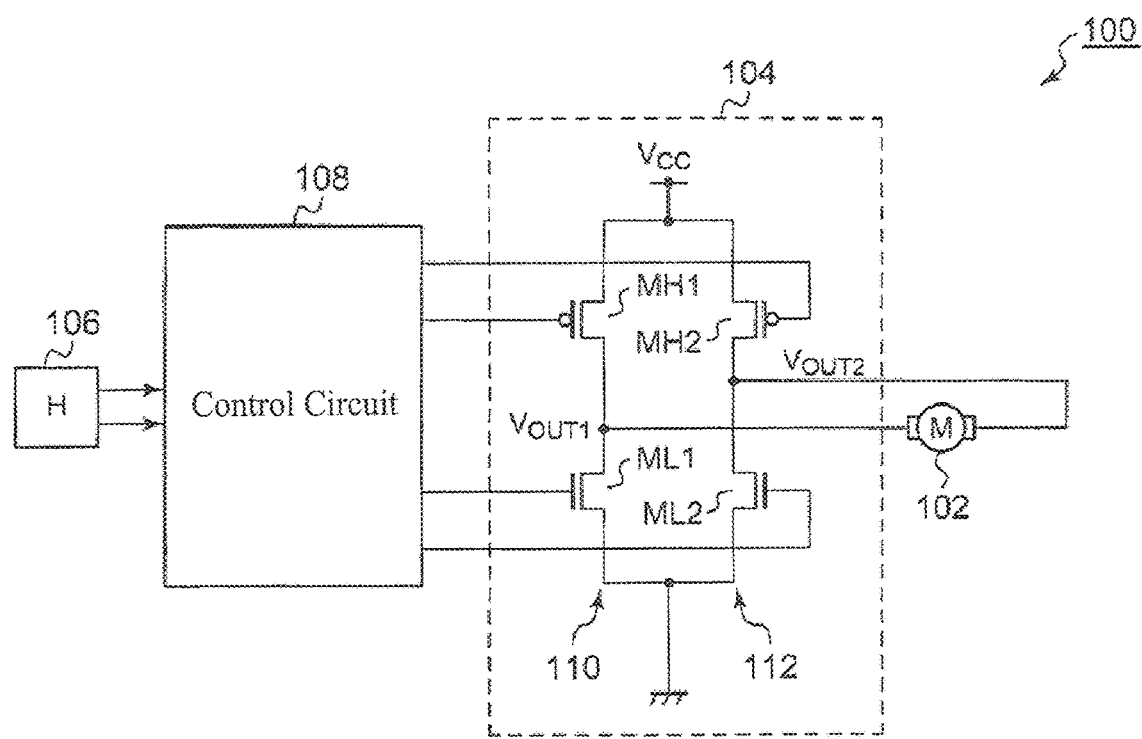
FIG. 4 is a block diagram showing a cooling device of an embodiment.

FIG. 4 is a block diagram showing a cooling device 100 of an embodiment. The cooling device 100 includes a fan motor 102, an H-bridge circuit 104, a Hall element 106 and a control circuit 108.

The H-bridge circuit 104 has an output connected to the single-phase motor 102. The Hall element 104 has two legs 110 and 112. The first leg 110 includes a high side transistor MH1 as an upper arm and a low side transistor ML1 as a lower arm. Similarly, the second leg 112 includes a high side transistor MH2 as an upper arm and a low side transistor ML2 as a lower arm. The output of the first leg 110 is represented as a voltage $V_{OUT1}$, and the output of the second leg 112 is represented as a voltage $V_{OUT2}$.

The Hall element 106 generates Hall signals H+ and H− indicating the rotor positions of the fan motor 102. The control circuit 108 switches the output phase of the H-bridge circuit 102 based on the Hall signals H+ and H−.

The control circuit 108 has the PWN soft switching function. In the soft switching duration Tss that starts before and ends after the output-phase switching, the control circuit 108 slowly varies a duty ratio of an output voltage $V_{OUT1}$ of one leg 110 of the H-bridge circuit 102 over time. Meanwhile, the control circuit 108 varies a duty ratio of an output voltage $V_{OUT2}$ of another leg 112 of the H-bridge circuit 102 in an opposite direction with respect to the duty ratio of the output voltage of the one leg. The duty ratios of the output voltages $V_{OUT1}$ and $V_{OUT2}$ of the two legs 110 and 112 can be complementarily varied in such a manner that their summation is fixed.

The above is the basic configuration of the cooling device 100. Next, the operation of the cooling device 100 will be described.

Figure 5:
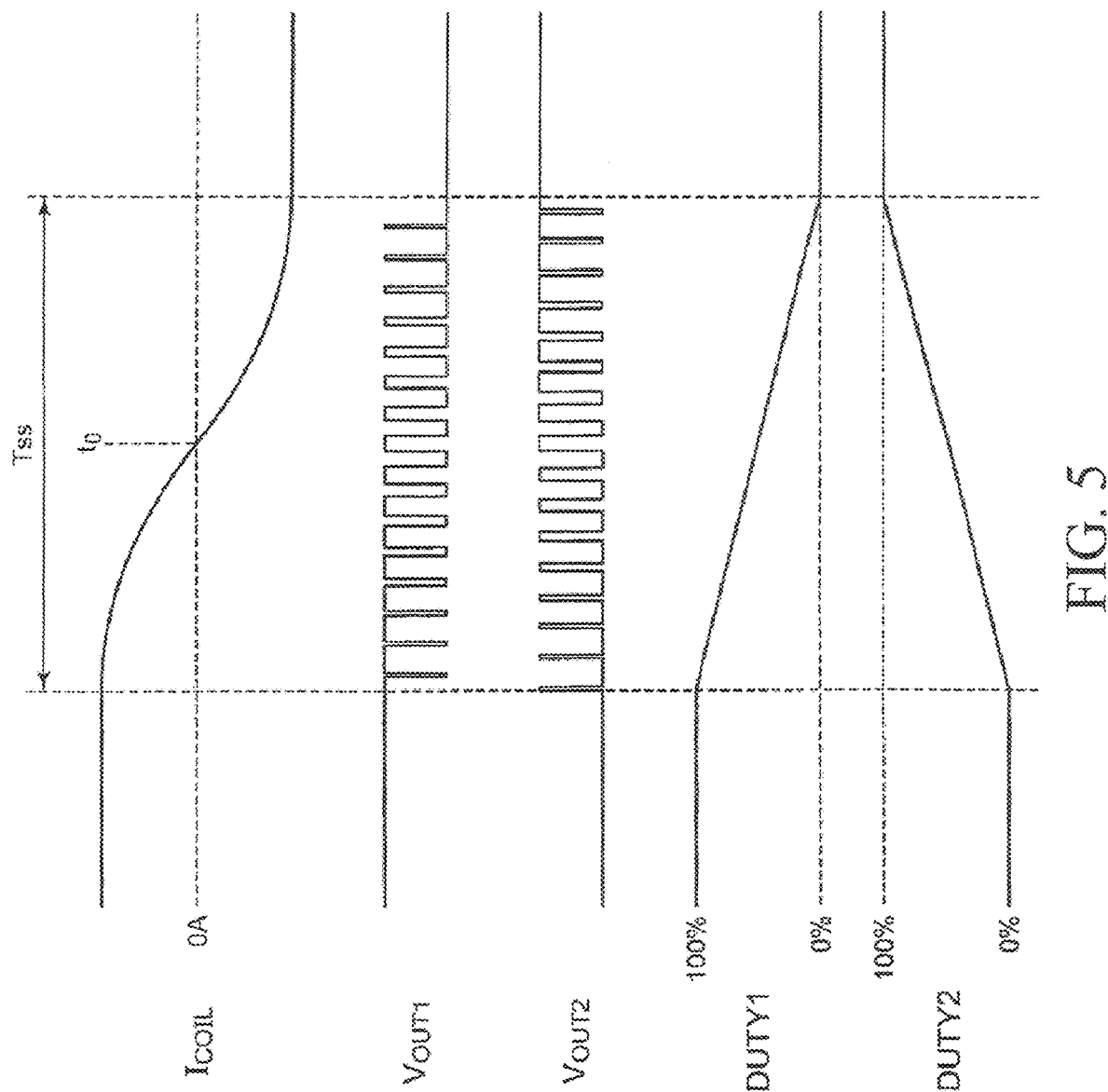
FIG. 5 is an operation waveform diagram of the cooling device in FIG. 4.

FIG. 5 is an operation waveform diagram of the cooling device in FIG. 4. Time to is the current zero crossing point at which the direction of the coil current is reversed. The switching timing of the output phase is set in such a manner as to coincide with the current zero crossing point, and the soft switching duration Tss is set in such a manner as to include the switching timing. DUTY1 indicates the duty ratio of the output voltage $V_{OUT1}$, and DUTY2 indicates the duty ratio of the output voltage $V_{OUT2}$.

Figure 2:
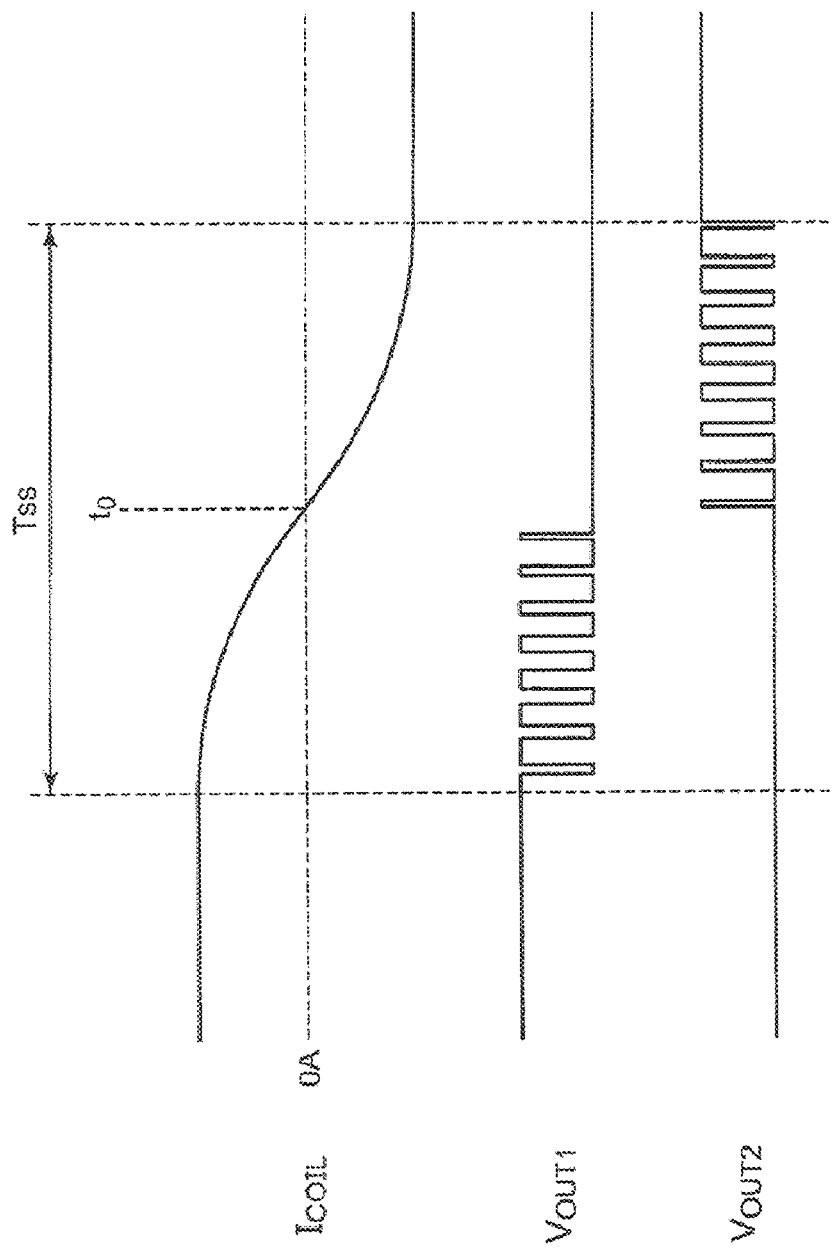
FIG. 2 is a waveform diagram illustrating the PWM soft switching.
Figure 3A:
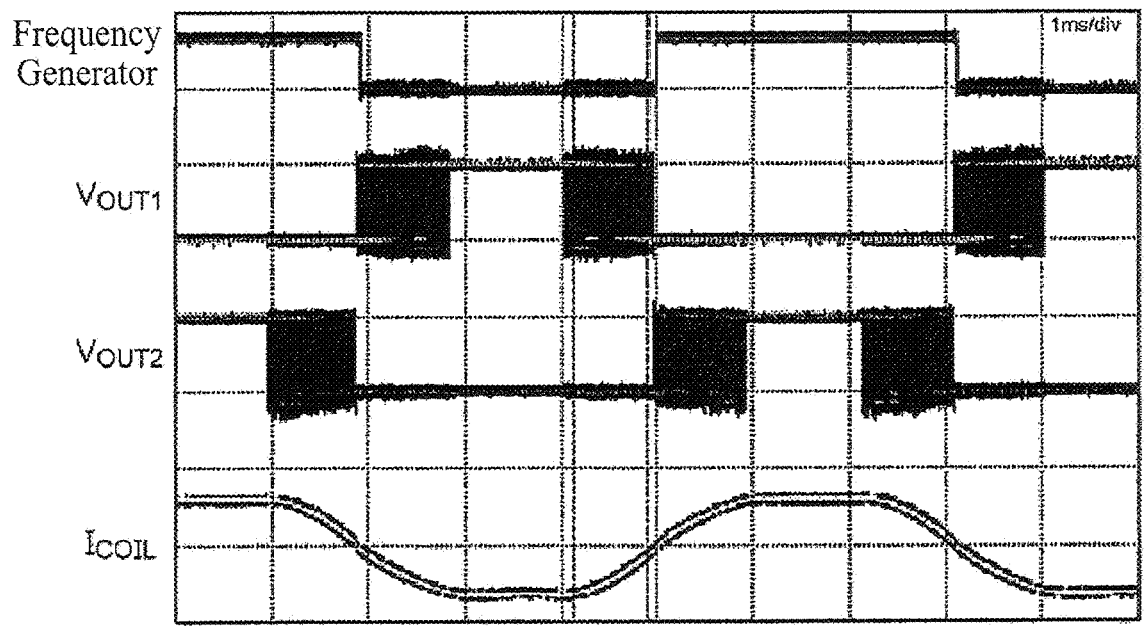
FIG. 3A is a diagram showing a waveform when a fan motor of a notebook computer with L=0.57 mH is driven.
Figure 3B:
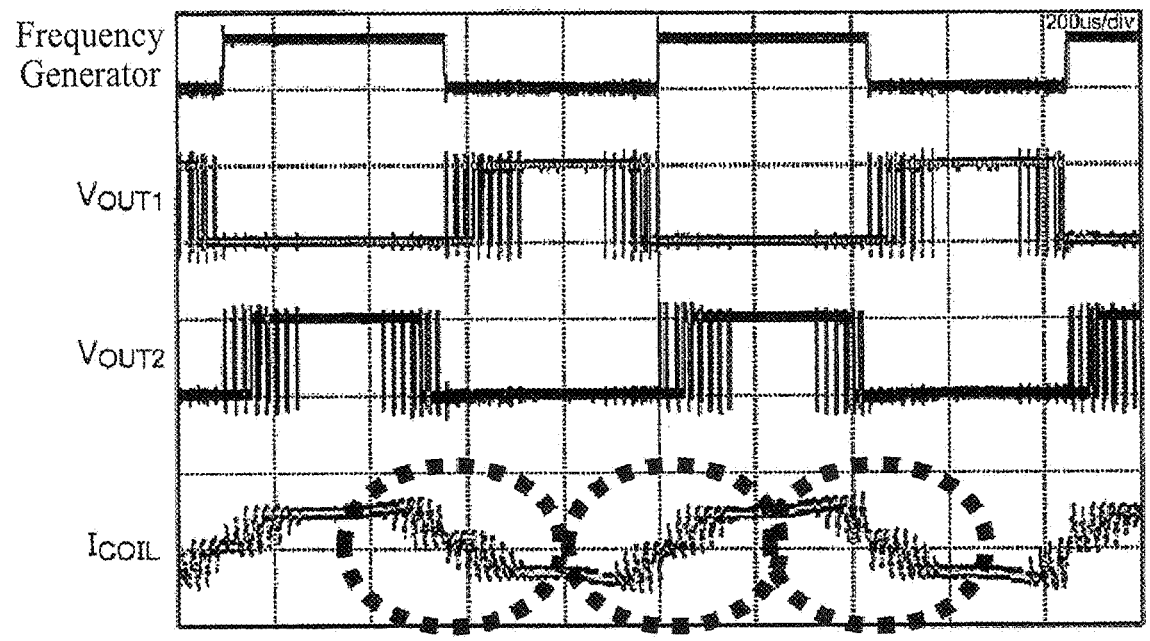
FIG. 3B is a diagram showing a waveform when an ultra-small fan motor with L=0.15 mH is driven.

The difference from the conventional soft switching (FIG. 2) is that in the first half of the soft switching duration Tss, not only the duty ratio DUTY1 of $V_{OUT1}$ but also the duty ratio DUTY2 of $V_{OUT2}$ are varied. In addition, in the latter half of the soft switching duration Tss, not only the duty ratio DUTY2 of $V_{OUT2}$ is varied, but also the duty ratio DUTY1 of $V_{OUT1}$ is varied. In this specification, the operation is referred to as WPWM (Wide Pulse Width Modulation) driving.

In other words, the duty ratio DUTY1 of the output voltage $V_{OUT1}$ is varied from the maximum value (here, 100%) to 0% throughout the soft switching duration Tss. The duty ratio DUTY2 of the output voltage $V_{OUT2}$ is varied from 0% to the maximum value (here, 100%) throughout the soft switching duration Tss.

Figure 6:
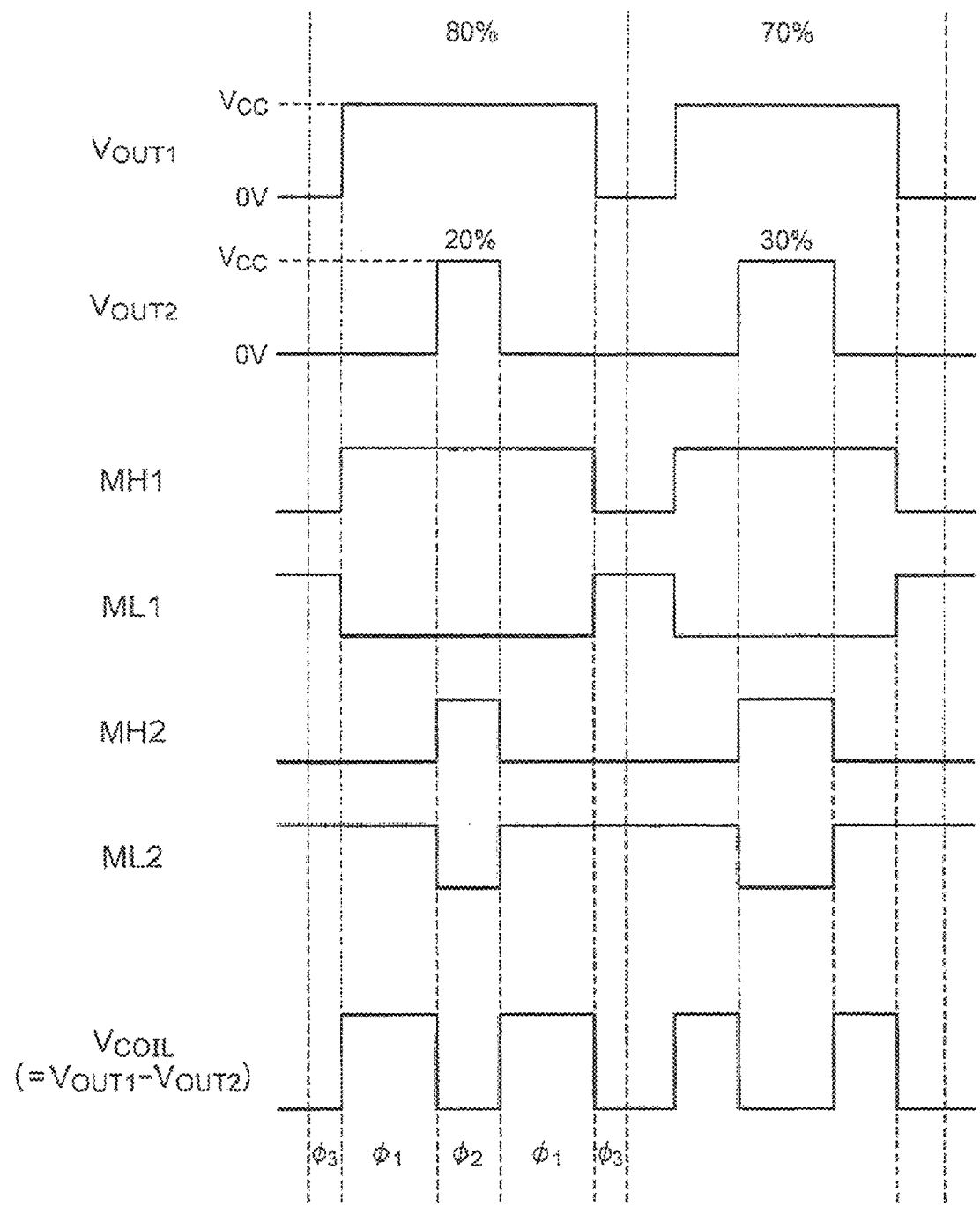
FIG. 6 is an operation waveform diagram of the H-bridge circuit.

FIG. 6 is an operation waveform diagram of the H-bridge circuit 104. Here, an example in which the duty ratio is varied to 80% and 70% in two consecutive cycles is shown. In fact, for each cycle, the duty cycle is reduced (increased) with a smaller step size. The driving voltage $V_{OUT1}-V_{OUT2}$ indicates the voltage applied to the motor coil.

Figures 7A, 7B, 7C:
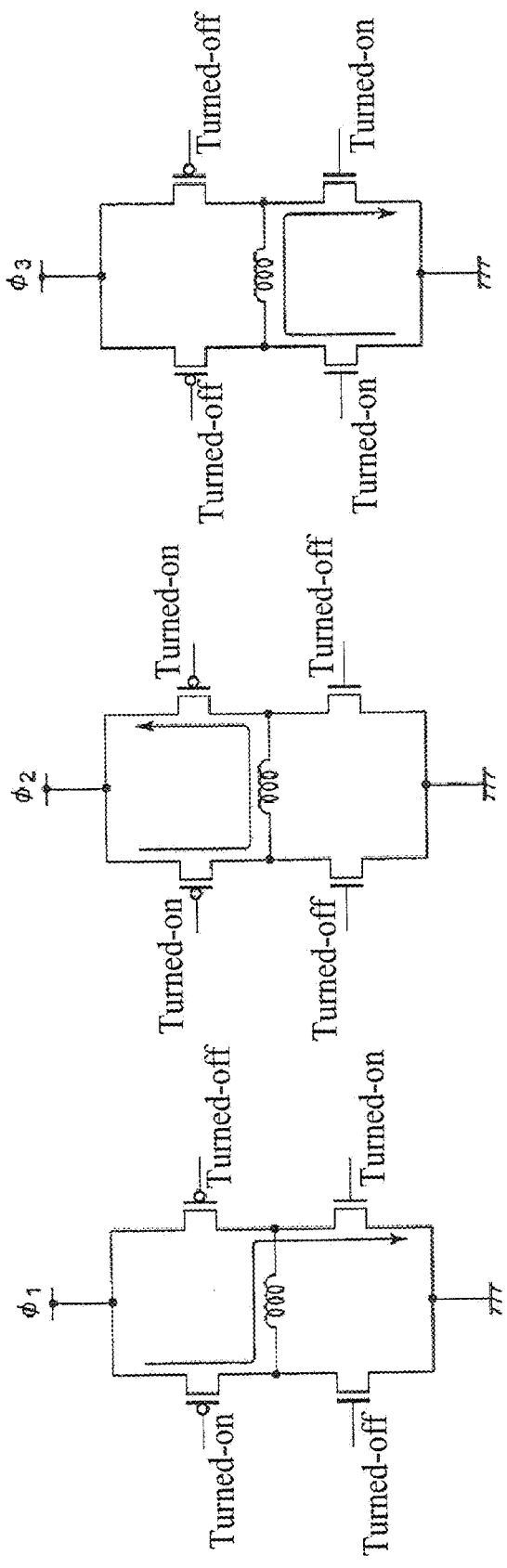
FIG. 7A to FIG. 7C are diagrams showing states the H-bridge circuit obtains in one switching cycle.

FIG. 7A to FIG. 7C are diagrams showing states the H-bridge circuit obtains in one switching cycle.

Although not shown in FIG. 6 and FIG. 7A to FIG. 7C, actually, in order to prevent flow through current, dead time is inserted. High side transistor and low side transistor of each leg are simultaneously turned off at the dead time.

The above is the operation of the cooling device 100.

According to the cooling device 100, by performing PWM driving on the two legs of the H-bridge circuit 102, the effective switching frequency of the voltage (driving voltage) $V_{COIL}=V_{OUT1}-V_{OUT2}$ between the two ends of the coil shown in FIG. 5 can be increased to twice the PWM frequency. Accordingly, the strain on the coil current $I_{COIL}$ can be suppressed. By suppressing the strain on the coil current $I_{COIL}$, the noise of the fan motor can be further reduced.

Figure 8A:
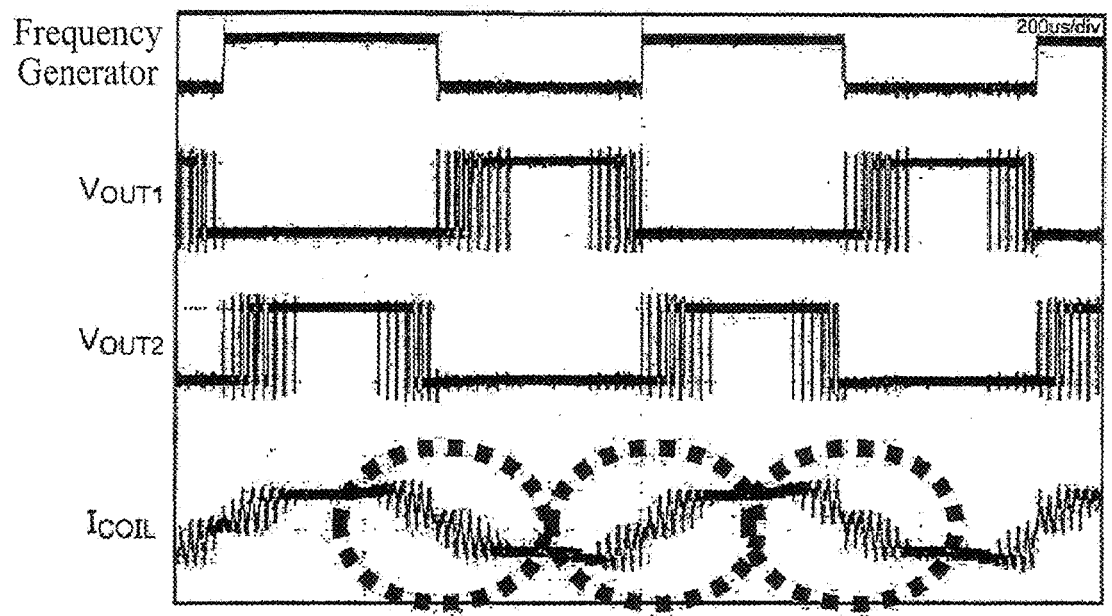
FIG. 8A is a waveform diagram when a motor having a small inductance is driven by a conventional driving method.
Figure 8B:
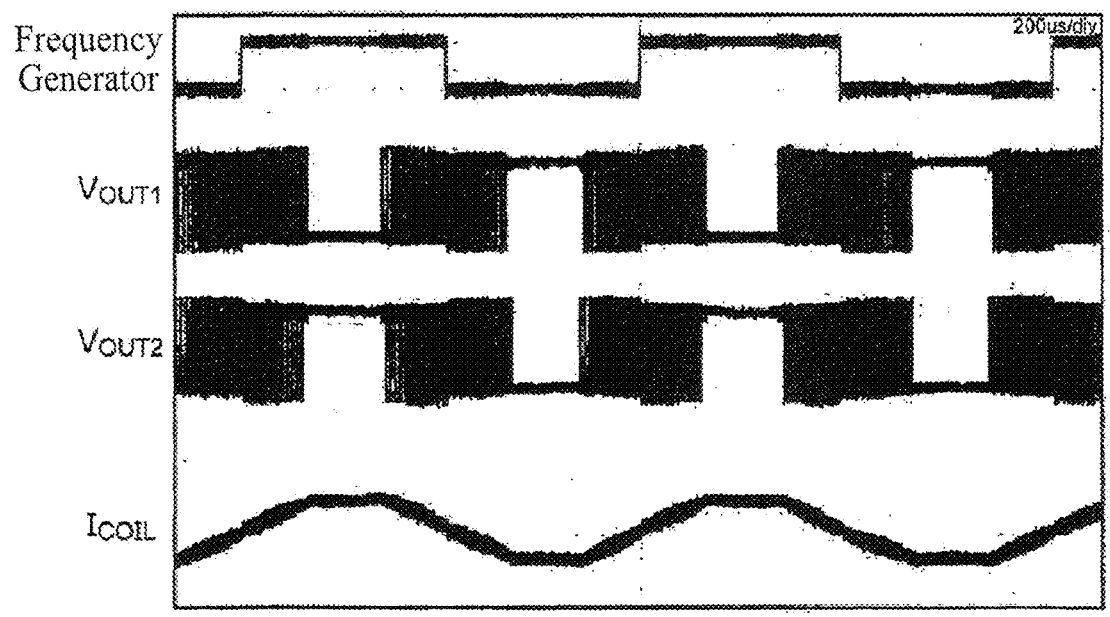
FIG. 8B is a waveform diagram when the same motor is driven by the driving method of the embodiment.

FIG. 8A is a waveform diagram when a motor having a small inductance is driven by a conventional driving method, and FIG. 8B is a waveform diagram when the same motor is driven by the driving method of the embodiment. In FIG. 8A, the PWM signal with 50 kHz is used, and the strain occurs on the coil current $I_{COIL}$.

In FIG. 8B, the PWM signal with 200 kHz is used, and thus the effective frequency of the voltage $V_{COIL}$ between the two ends of the coil is 400 kHz. In this case, the strain on the coil current Icon, is eliminated.

In other words, if it is desired to suppress the strain on the coil current by the conventional driving method, increasing the PWM frequency to 400 kHz is required. For the driving method of the embodiment, half frequency, i.e. 200 kHz, is sufficient for the PWM frequency. As long as the PWM frequency can be reduced, the operation frequency of the driving circuit and the power consumption can also be reduced.

The present invention relates to various devices, circuits, and methods derived from the above description, and is not limited to a particular configuration. Hereinafter, more specific configurations or variations will be described to assist in understanding the essence of the present invention or the circuit operations, and to clarify the contents without narrowing the scope of the present invention.

First Embodiment

Figure 9:
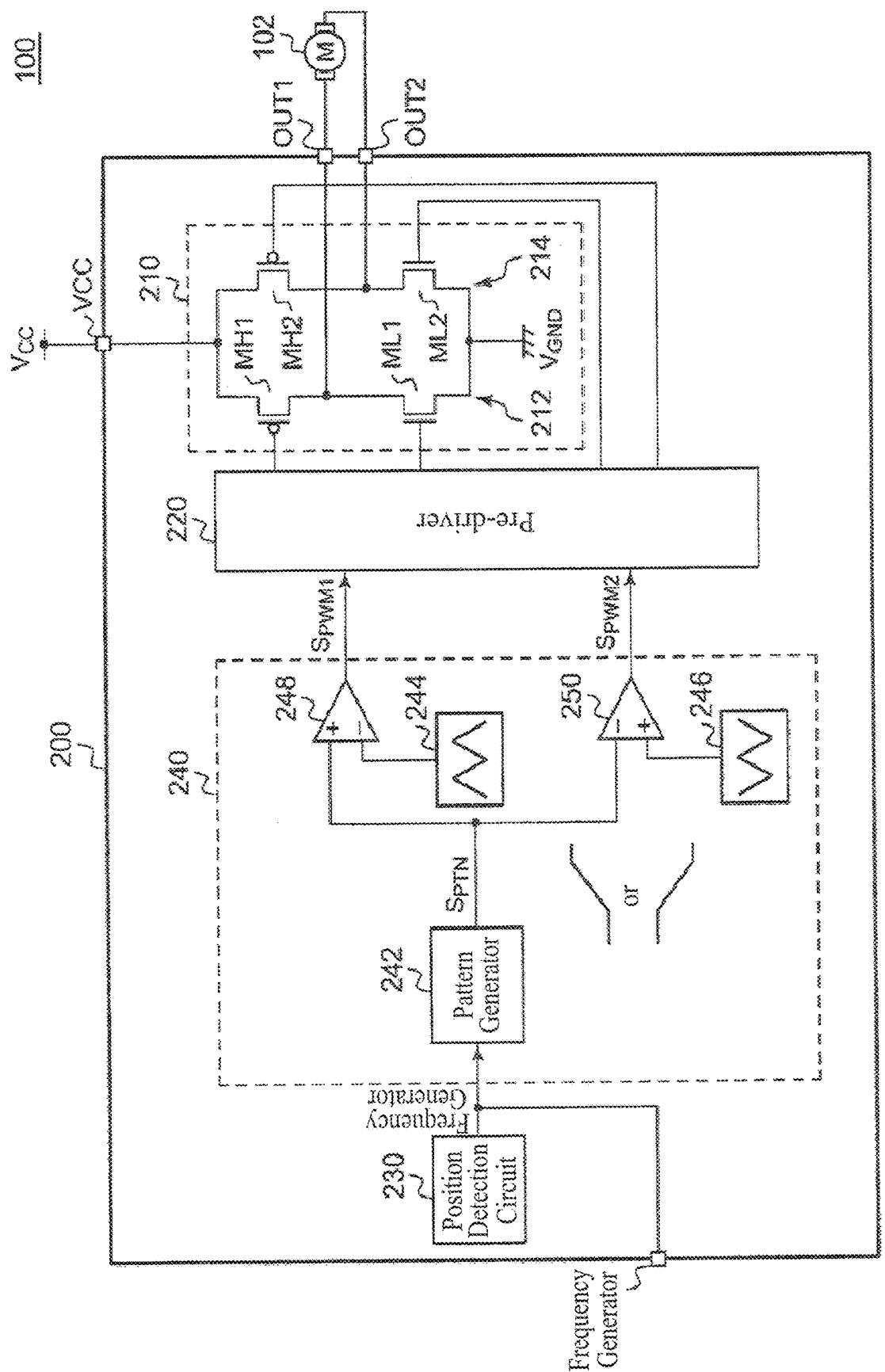
FIG. 9 is a circuit diagram of the cooling device having the fan motor driving IC of the first embodiment.

FIG. 9 is a circuit diagram of the cooling device 100 having the fan motor driving IC 200 of the first embodiment. The fan motor driving IC 200 is a functional IC that integrates the H-bridge circuit 104, the Hall element 106 and the control circuit 108 of FIG. 4.

The fan motor driving IC 200 includes an H-bridge circuit 210 and a pre-driver 220. The fan motor driving IC 200 also includes a position detection circuit 230 and a driving-signal generating portion 240.

The H-bridge circuit 210 includes a first leg 212 and a second leg 214. An output of the first leg 212 is connected to one end of the fan motor 102 via a first output (OUT1) pin, and an output of the second leg 214 is connected to another end of the fan motor 102 via a second output (OUT2) pin.

The position detection circuit 230 generates an FG signal indicating a rotor position of the fan motor 102. The position detection circuit 230, for example, can also include a Hall element, a Hall amplifier and a Hall comparator. Specifically, the two complementary Hall signals generated by the Hall element can be amplified, and the amplified Hall signals are compared to generate the FG signal with a rectangular wave. The Hall element can be integrated either on the fan motor driving IC 200, or with an external element.

The pre-driver 220 and the FG signal synchronously switch the output phase of the H-bridge circuit 210. For example, the section in which the FG signal is a first level (for example, low level) allows the output voltage $V_{OUT1}$ of the first leg to be valid, and allows the output of the second leg to be zero. In addition, the section in which the FG signal is a second level (for example, high level) allows the output voltage $V_{OUT2}$ of the second leg to be valid, and allows the output of the first leg to be zero.

The driving-signal generating portion 240 sets the soft switching duration Tss based on the FG signal. The method for setting the soft switching duration Tss is not particularly limited, and any conventional technique can be used. For example, the cycle $T_{FG}$ of the FG signal can also be measured by a counter, and the measured period $T_{FG}$ is multiplied by a specific coefficient α to determine the length of the soft switching duration Tss.

The driving-signal generating portion 240 generates a first PWM signal $S_{PWM1}$ and a second PWM signal $S_{PWM2}$ in the set soft switching duration Tss. A duty ratio of the first PWM signal $S_{PWM1}$ varies in a first direction over time, and a duty ratio of the second PWM signal $S_{PWM2}$ varies in a second direction opposite to the first direction while the duty ratio of the first PWM signal $S_{PWM1}$ varies.

For example, when the FG signal transitions from high level to low level, the duty ratio of the first PWM signal $S_{PWM1}$ increases from 0% to 100%, and the duty ratio of the second PWM signal $S_{PWM2}$ decreases from 100% to 0%. When the FG signal transitions from low level to high level, the duty ratio of the first PWM signal $S_{PWM1}$ decreases from 100% to 0%, and the duty ratio of the second PWM signal $S_{PWM2}$ increases from 0% to 100%.

The pre-driver 220 drives the first leg 212 of the H-bridge circuit 210 based on the first PWM signal $S_{PWM1}$. For example, in the section in which the first PWM signal $S_{PWM1}$ is high level, the OUT1 pin generates an output voltage $\text{\textbackslash T}_{OUT1}$ of high level ($V_{CC}$), and in the section in which the first PWM signal $S_{PWM1}$ is low level, the OUT1 pin generates an output voltage $V_{OUT1}$ of the level ($V_G$ND). Specifically, when $S_{PWM1}$=H, the pre-driver 220 turns on the high side transistor MH1 and turns off the low side transistor ML1, and when $S_{PWM1}$=L, the pre-driver 220 turns off the high side transistor MH1 and turns on the low side transistor ML1.

In addition, the pre-driver 220 drives the second leg 214 of the H-bridge circuit 210 based on the second PWM signal $S_{PWM2}$. For example, in the section in which the second PWM signal $S_{PWM2}$ is high level, the OUT2 pin generates an output voltage $V_{OUT2}$ of high level ($V_{CC}$), and in the section in which the second PWM signal $S_{PWM2}$ is low level, the OUT2 pin generates an output voltage $V_{OUT2}$ of low level ($V_G$ND). Specifically, when $S_{PWM2}$=H, the pre-driver 220 turns on the high side transistor MH2 and turns off the low side transistor ML2, and when $S_{PWM2}$=L, the pre-driver 220 turns off the high side transistor MH2 and turns on the low side transistor ML2.

Next, a specific configuration example of the driving-signal generating unit 240 will be described. The driving-signal generating portion 240 includes a pattern generator 242, a first cycle-signal generator 244, a second cycle-signal generator 246, a first comparator 248 and a second comparator 250. The pattern generator 242 generates a waveform-controlling pattern $S_{PTN}$ in the soft switching duration Tss, and the waveform-controlling pattern $S_{PTN}$ increases or decreases over time. The first cycle-signal generator 244 generates a first cycle-signal $S_{OCS1}$. The second cycle-signal generator 246 generates a second cycle-signal $S_{OSC2}$ having a reversed phase relative to the first cycle-signal $S_{OCS1}$. Preferably, the cycle-signals $S_{OCS1}$ and $S_{OSC2}$ are triangular waves, and other waveforms such as a ramp wave can also be used.

The first comparator 248 compares the waveform-controlling pattern $S_{PTN}$ with the first cycle-signal $S_{OCS1}$ to generate the first PWM signal $S_{PWM1}$ based on the comparing result. The second comparator 250 compares the waveform-controlling pattern $S_{PTN}$ with the second cycle-signal $S_{OSC2}$ to generate the second PWM signal $S_{PWM2}$ based on the comparing result.

The above is the configuration of the driving-signal generating portion 240. Next, the operation of the fan motor driving IC 200 of FIG. 9 will be described.

Figure 10:
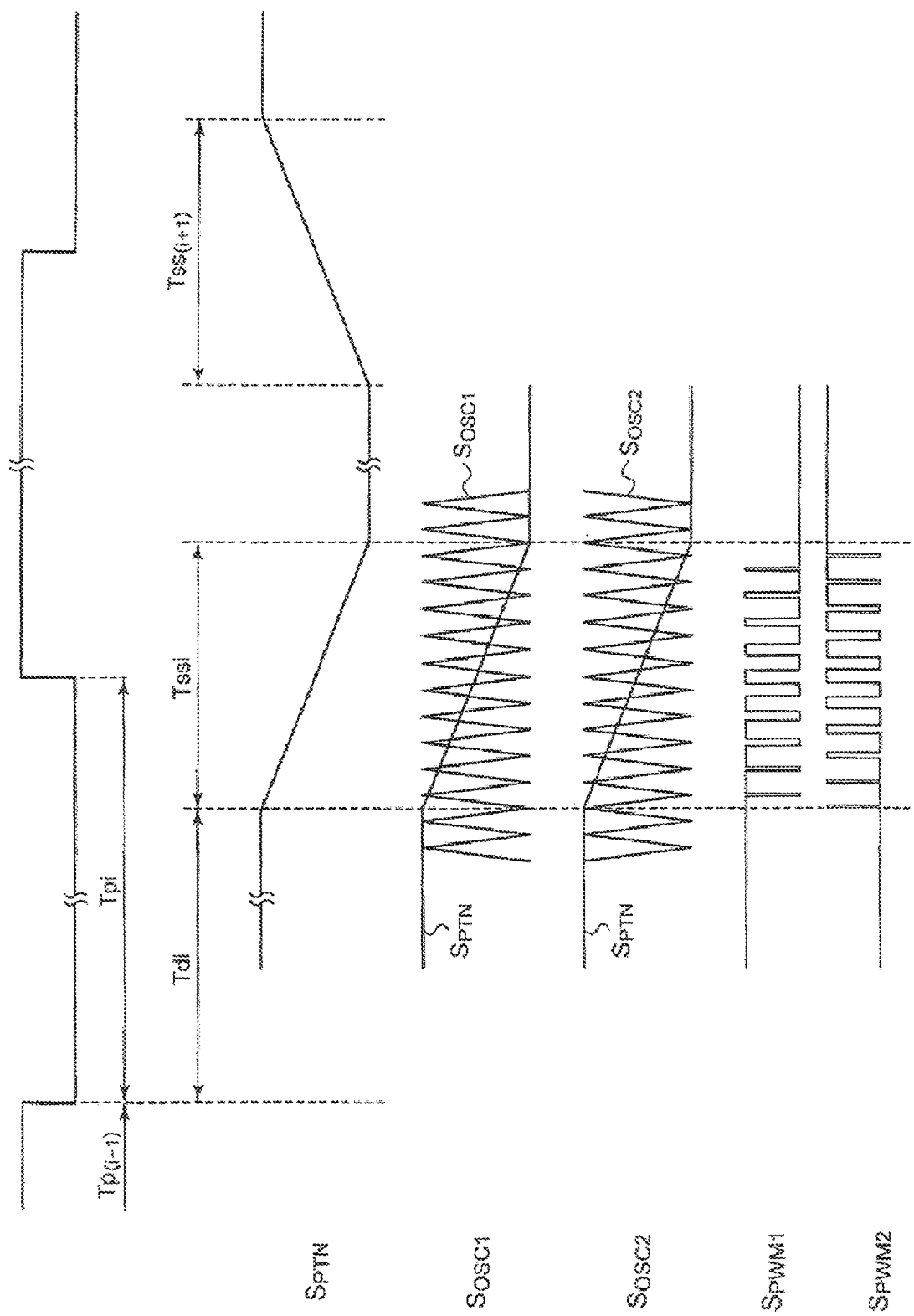
FIG. 10 is an operation waveform diagram of the fan motor driving IC shown in FIG. 9.

FIG. 10 is an operation waveform diagram of the fan motor driving IC 200 shown in FIG. 9. The pattern generator 242 can also determine the cycle Tp of the FG signal, and set the time proportional to the cycle Tp as the soft switching duration Tss. The length of the soft switching duration $Tss_i$ of the ith cycle is determined based on the previous $Tp_{(i-1)}$ cycle.

$$Tss_i = Tp_{(i-1)} \times K$$

K is a specific coefficient, and K<1.

The start point of the soft switching initiation duration $Tss_i$ can be set to be after a certain delay time Td from the nearest edge of the FG signal. The delay time $Td_i$ is proportional to the cycle $Tp_{(i-1)}$ of the one cycle previous FG signal.

$$Td_i = Tp_{(i-1)} \times (1 - K/2)$$

In the soft switching duration Tss, the driving-signal generating portion 240 allows the pattern $S_{PTN}$ to be varied between a maximum value and a minimum value. The direction in which the control pattern $S_{PTN}$ is varied is corresponding to the level of the FG signal. In this example, when the FG signal transitions from low level to high level, the control pattern $S_{PTN}$ is increased, and when the FG signal transitions from high level to low level, the control pattern $S_{PTN}$ is decreased.

The control pattern $S_{PTN}$ is compared with the two cycle-signals $S_{OSC1}$ and $S_{OSC2}$ having reversed phases. Two PWM signals $S_{PWM1}$ and $S_{PWM2}$ are generated. Duty cycles of the two PWM signals $S_{PWM1}$ and $S_{PWM2}$ complementarily vary.

Second Embodiment

Figure 11:
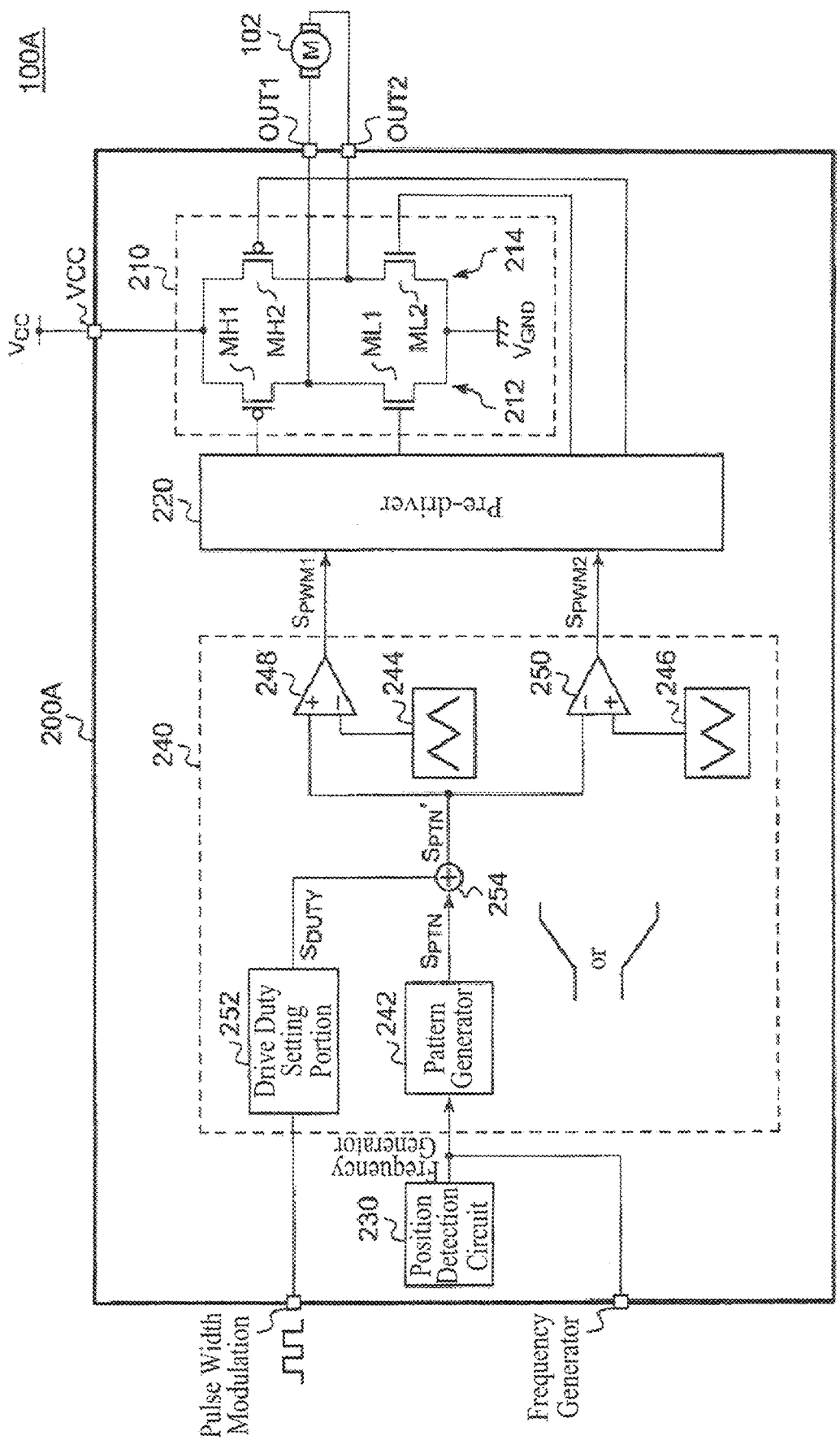
FIG. 11 is a circuit diagram of the cooling device having the fan motor driving IC of the second embodiment.

FIG. 11 is a circuit diagram of the cooling device 100A having the fan motor driving IC 200A of the second embodiment.

In the fan motor driving IC 200 of FIG. 9, the maximum value of the duty cycles of the first PWM signal $S_{PWM1}$ and the second PWM signal $S_{PWM2}$ is fixed as 100%, and thus the number of revolutions is fixed. In contrast, the fan motor driving IC 200A of FIG. 11 is configured to allow the number of revolutions of the fan motor 102 to be variable. Specifically, in the fan motor driving IC 200A shown in FIG. 11, in a normal driving duration except the soft switching duration, a difference |DUTY1−DUTY2| between the duty ratio of the first PWM signal $S_{PWM1}$ and the duty ratio of the second PWM signal $S_{PWM2}$ is variable with respect to the target number of revolutions of the fan motor.

The fan motor driving IC 200A includes a control terminal receiving an instruction signal indicating the target number of revolutions of the fan motor 102. In this embodiment, the control terminal is a PWM terminal to which a PWM signal having a duty ratio proportional to the target number of revolutions is input. A drive duty cycle generating portion 252 generates a duty cycle instruction value $S_{DUTY}$ corresponding to the duty ratio of the PWM signal input to the PWM terminal. The duty cycle instruction value $S_{DUTY}$ can vary from 0 to 100%.

The driving-signal generating portion 240 further includes a drive duty setting portion 252 and a scaler 254. The drive duty setting portion 252 generates a coefficient (duty cycle instruction value) $S_{DUTY}$ corresponding to the target number of revolutions. The scaler 254 multiplies the waveform control pattern $S_{PTN}$ by the duty cycle instruction value $S_{DUTY}$ and scales it. The scaled waveform control pattern $S_{PTN}$ is provided to the first comparator 248 and the second comparator 250.

Figure 12:
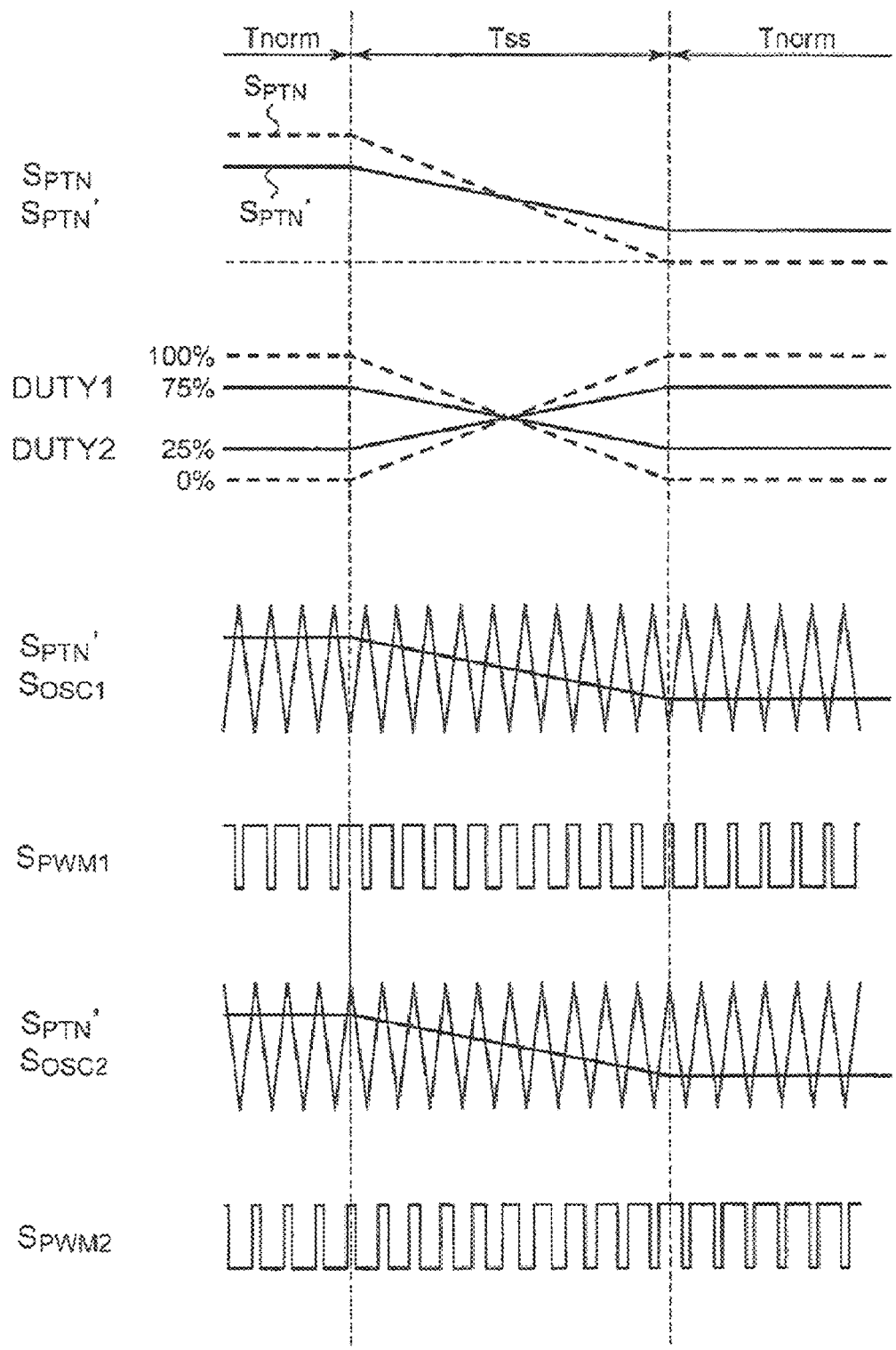
FIG. 12 is an operation waveform diagram of the fan motor driving IC shown in FIG. 11.

FIG. 12 is an operation waveform diagram of the fan motor driving IC 200A shown in FIG. 11. The operation when the duty cycle instruction value $S_{DUTY}$ is 50% is shown.

According to the fan motor driving IC 200A shown in FIG. 11, the number of revolutions of the fan motor can be controlled, and the duty ratio is slowly varied in the soft switching duration.

In this embodiment, a summation of the duty ratio of the first PWM signal $S_{PWM1}$ and the duty ratio of the second PWM signal $S_{PWM2}$ can be kept as 100%. In other words, in the normal driving duration, Tnorm, the switching of the voltages $V_{OUT1}$ and $V_{OUT2}$ of the two legs of the H-bridge circuit can realize the WPWM driving. Accordingly, even in the normal operation duration Tnorm, the strain on the coil current can also be suppressed. In addition, the effective switching frequency of the driving voltage ($V_{OUT1}-V_{OUT2}$) in the normal driving duration Tnorm can coincide with the effective switching frequency of the driving voltage ($V_{OUT1}-V_{OUT2}$) in the soft switching duration Tss.

The present invention has been described above based on the embodiments. A person skilled in the art will understand that the embodiments are exemplified, and various modifications may be made to the combinations of various components and treating processes. Further, these variations are also within the scope of the present invention. Hereinafter, these variations will be described.

(First Variation)

Figure 13:
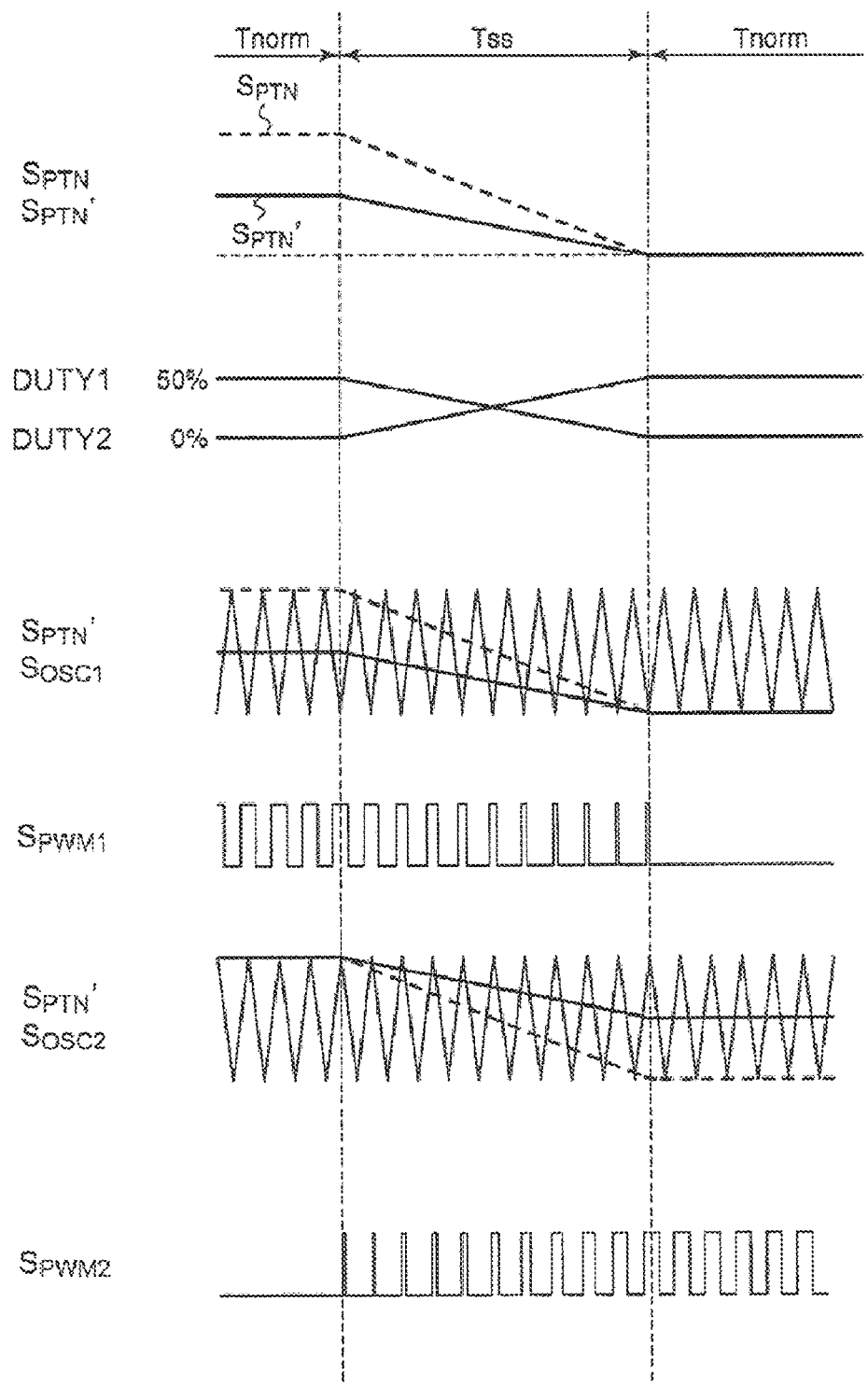
FIG. 13 is a waveform diagram showing control of the first variation.

In the waveform diagram shown in FIG. 12, in the normal driving duration Tnorm except the soft switching duration Tss, both the PWM signal $S_{PWM1}$ and the PWM signal $S_{PWM2}$ are not zero. However, the present invention is not limited thereto. FIG. 13 is a waveform diagram showing control of the first variation. In the first variation, in the normal driving duration Tnorm, one duty cycle of two PWM signal $S_{PWM1}$ and the PWM signal $S_{PWM2}$ is fixed to zero.

In the normal driving duration Tnorm, the coil current is substantially fixed, and thus the waveform strain and the resulting noise are less likely to be a problem. Therefore, in the normal driving duration Tnorm, the PWM can drive only one of the two legs as in the related art.

The configuration of hardware for realizing the waveform diagram shown in FIG. 13 is not particularly limited. A person skilled in the art can realize that proper modifications may be made to the configuration of FIG. 9.

(Second Variation)

Figure 14:
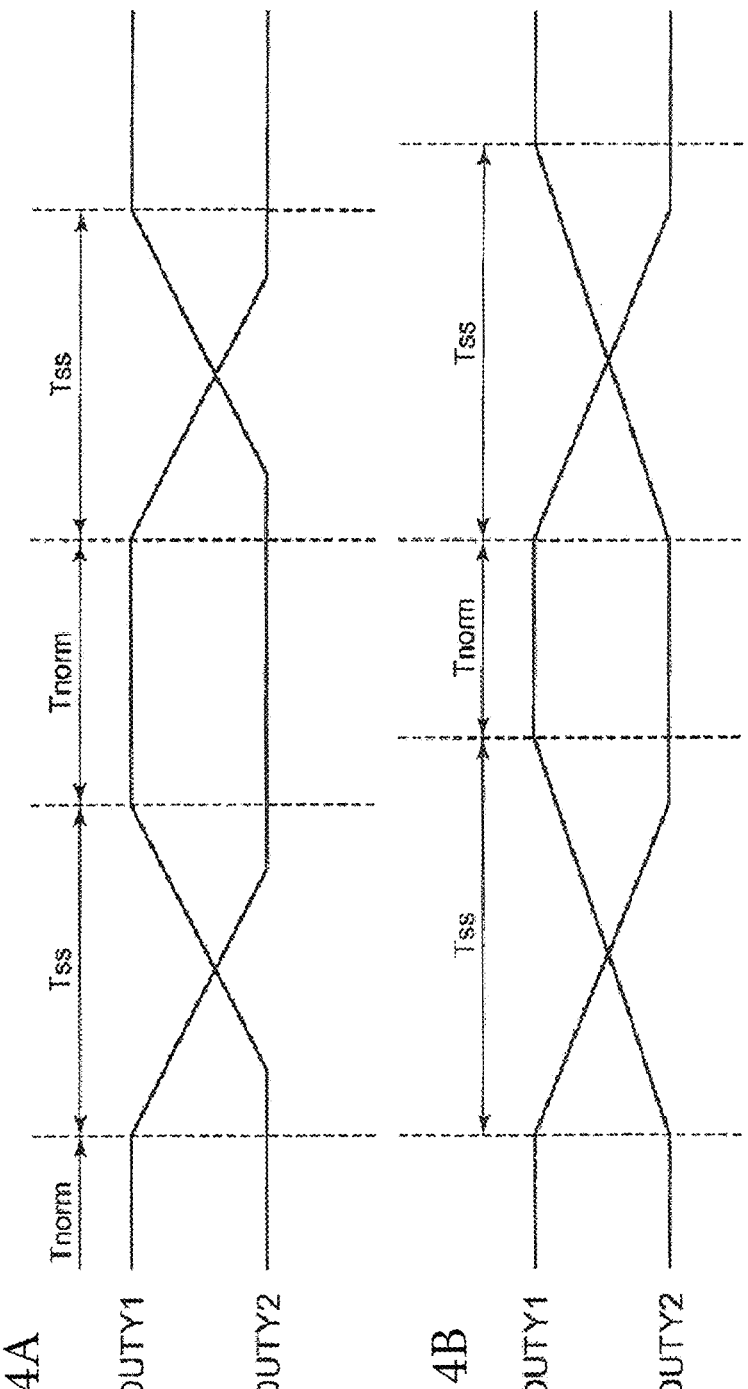
FIG. 14A and FIG. 14B are waveform diagrams showing the duty ratio control of the variation.

FIG. 14A and FIG. 14B are waveform diagrams showing the duty ratio control of the variation. In the first and second embodiments, the duty ratios DUTY1 and DUTY2 of the two PWM signals $S_{PWM1}$ and $S_{PWM2}$ can be complementarily varied. However, the present invention is not limited thereto. As shown in FIG. 14A, one duty ratio may be varied first, and the variation of the other duty ratio may be delayed.

In addition, as shown in FIG. 14B, the time for varying one duty cycle can also be different from the time for varying the other duty cycle.

(Third Variation)

In addition, when the switching of a leg is stopped during the normal driving duration, the output of the stopped leg can also be fixed to high level, that is, the duty ratio is fixed to 100%.

(Fourth Variation)

In FIG. 9 or FIG. 11, the PWM signal is input to the control terminal for setting the number of revolutions. However, the present invention is not limited thereto. For example, digital control signal or analog control signal indicating the number of revolutions can also be input to the control terminal, and a duty instruction value $S_{DUTY}$ is generated based on the control signal.

Alternatively, a temperature sensor, such as a thermistor or a positive temperature coefficient thermistor, can be connected to the control terminal to generate a duty instruction value $S_{DUTY}$ based on a voltage generated by the control terminal. In this case, the number of revolutions can be controlled according to the temperature.

(Fifth Variation)

In addition, the driving method of the present embodiment is

In addition, the driving method according to the embodiments is not limited to be applied to driving of fan motor, and can also be applied to driving of small and/or thin motor having smaller coil inductance.

(Usage)

Figure 15:
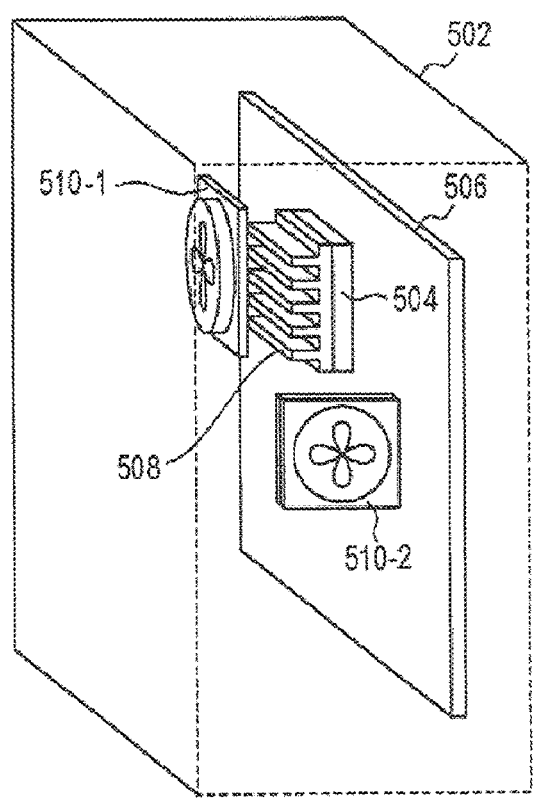
FIG. 15 shows an electronic machine having the cooling device of the embodiment.

FIG. 15 shows an electronic machine having the cooling device of the embodiment. For example, the electronic machine 500 can be various electronic devices such as server, laptop, desktop computer, portable computer, game device, projector and VR (Virtual Reality) etc. The electronic machine 500 includes a casing 502, a CPU 504, a motherboard 506, a heat sink 508 and a plurality of cooling devices 510.

The CPU 504 is mounted on the motherboard 506. The heat sink 508 is in close contact with the upper surface of the CPU 504. The cooling device 510_1 is disposed opposite to the heat sink 508, and blows air to the heat sink 508. The cooling device 510_2 is disposed on the back surface of the casing 502, and external air is introduced inside the casing 502.

The cooling device 500 can be mounted on refrigerator, automobile, industrial machine, or the like, in addition to the electronic device 500 of FIG. 15.

The present invention has been described with reference to the specific embodiments, the embodiments are only intended to illustrate the principles and applications of the present invention, and the embodiments may be practiced without departing from the spirit of the invention as defined in the appended claims. The embodiments allow for multiple variations or changes of configurations.

What is claimed is:

1. A fan motor driving circuit controlling a single-phase motor and comprising:
    a driving-signal generating portion, generating a first PWM (Pulse Width Modulation) signal and a second PWM signal in a soft switching duration that starts before and ends after an output-phase switching of an H-bridge circuit connected to the single-phase motor, wherein a duty ratio of the first PWM signal varies in a first direction over time, and a duty ratio of the second PWM signal varies in a second direction opposite to the first direction while the duty ratio of the first PWM signal varies; and
    a pre-driver, driving one leg of the H-bridge circuit based on the first PWM signal and driving another leg of the H-bridge circuit based on the second PWM signal.

2. The fan motor driving circuit of claim 1, wherein in the soft switching duration, a summation of the duty ratio of the first PWM signal and the duty ratio of the second PWM signal is fixed.

3. The fan motor driving circuit of claim 1, wherein the driving-signal generating portion comprises:
    a first cycle-signal generator, generating a first cycle-signal;
    a second cycle-signal generator, generating a second cycle-signal having a reversed phase relative to the first cycle-signal;
    a pattern generator, generating a waveform-controlling pattern in the soft switching duration, the waveform-controlling pattern increasing or decreasing over time;
    a first comparator, comparing the first cycle-signal with the waveform-controlling pattern, and generating the first PWM signal based on the comparing result; and
    a second comparator, comparing the second cycle-signal with the waveform-controlling pattern, and generating the second PWM signal based on the comparing result.

4. The fan motor driving circuit of claim 3, wherein the first cycle-signal and the second cycle-signal are triangle waves.

5. The fan motor driving circuit of claim 1, wherein in a normal driving duration, a difference between the duty ratio of the first PWM signal and the duty ratio of the second PWM signal is variable with respect to a target number of revolutions of the single-phase motor.

6. The fan motor driving circuit of claim 5, wherein a summation of the duty ratio of the first PWM signal and the duty ratio of the second PWM signal is 100%.

7. The fan motor driving circuit of claim 5, wherein in the normal driving duration, one of the duty ratio of the first PWM signal and the duty ratio of the second PWM signal is 0% or 100%.

8. The fan motor driving circuit of claim 4, wherein the driving-signal generating portion comprises:
    a first cycle-signal generator, generating a first cycle-signal;
    a second cycle-signal generator, generating a second cycle-signal having a reversed phase relative to the first cycle-signal;
    a pattern generator, generating a waveform-controlling pattern in the soft switching duration, the waveform-controlling pattern increasing or decreasing over time;
    a scaler, scaling the waveform-controlling pattern with a coefficient corresponding to the target number of revolutions;
    a first comparator, comparing the first cycle-signal with an output of the scaler, and generating the first PWM signal based on the comparing result; and
    a second comparator, comparing the second cycle-signal with an output of the scaler, and generating the second PWM signal based on the comparing result.

9. The fan motor driving circuit of claim 1, wherein the driving-signal generating portion sets the soft switching duration based on a Hall signal representing a rotor position of the single-phase motor.

10. The fan motor driving circuit of claim 9, further comprising a Hall element generating the Hall signal.

11. The fan motor driving circuit of claim 1, wherein the fan motor driving circuit is integrated on one semiconductor substrate.

12. The fan motor driving circuit of claim 1, wherein the H-bridge circuit is further integrated.

13. A cooling device, comprising:
    a single-phase motor; and
    the fan motor driving circuit of claim 1, driving the single-phase motor.

14. A electronic machine, comprising:
    the cooling device of claim 13.

15. A cooling device, comprising:
    a single-phase motor;
    an H-bridge circuit, having an output connected to the single-phase motor;

a Hall element, generating a Hall signal representing a rotor position of the single-phase motor; and a control circuit, switching an output phase of the H-bridge circuit based on the Hall signal, and in a soft switching duration that starts before and ends after the output-phase switching, slowly varying a duty ratio of an output voltage of one leg of the H-bridge circuit, and meanwhile, varying a duty ratio of an output voltage of another leg of the H-bridge circuit in an opposite direction with respect to the duty ratio of the output voltage of the one leg.

16. The cooling device of claim 15, wherein in a normal driving duration, a difference between the duty ratios of the output voltages of the two legs of the H-bridge circuit is variable with respect to a target number of revolutions of the single-phase motor.

17. The cooling device of claim 16, wherein a summation of the duty ratios of the output voltages of the two legs of the H-bridge circuit is 100%.

18. The cooling device of claim 16, wherein in the normal driving duration, the duty ratio of the output voltage of the one leg of the H-bridge circuit is 0% or 100%.

19. A driving method for driving a single-phase motor, comprising:

generating a Hall signal representing a rotor position of the single-phase motor;

switching an output phase of the H-bridge circuit based on the Hall signal;

setting a soft switching duration that starts before and ends after the output-phase switching; and in the soft switching duration, slowly varying a duty ratio of an output voltage of one leg of the H-bridge circuit, and meanwhile, varying a duty ratio of an output voltage of another leg of the H-bridge circuit in an opposite direction with respect to the duty ratio of the output voltage of the one leg.

* * * * *